United States Patent
Lee et al.

(10) Patent No.: US 6,329,854 B1
(45) Date of Patent: Dec. 11, 2001

(54) PHASE LOCKED LOOP INTEGRATED CIRCUITS HAVING DYNAMIC PHASE LOCKING CHARACTERISTICS AND METHODS OF OPERATING SAME

(75) Inventors: Sang-bo Lee; Jae-hyoong Lee, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/387,376

(22) Filed: Aug. 31, 1999

(30) Foreign Application Priority Data

Sep. 2, 1998 (KR) .................................................. 98-36094

(51) Int. Cl.[7] .............................. H03L 7/06; H03K 5/13
(52) U.S. Cl. ........................................ 327/158; 327/237
(58) Field of Search ................................... 327/158, 149, 327/236, 237, 270, 276, 156

(56) References Cited

U.S. PATENT DOCUMENTS

| | | | |
|---|---|---|---|
| 4,749,961 | 6/1988 | Kato et al. | 331/14 |
| 4,789,996 | * 12/1988 | Butcher | 327/158 |
| 4,873,491 | * 10/1989 | Wilkins | 27/280 |
| 5,229,752 | 7/1993 | Gliebe et al. | 340/658 |
| 5,336,939 | 8/1994 | Eitrheim et al. | 327/291 |
| 5,345,119 | 9/1994 | Khoury | 327/553 |
| 5,355,037 | 10/1994 | Andresen et al. | 327/158 |
| 5,394,022 | * 2/1995 | Murakami et al. | 327/278 |
| 5,463,337 | 10/1995 | Leonowich | 327/158 |
| 5,544,203 | 8/1996 | Casasanta et al. | 375/376 |
| 5,554,945 | 9/1996 | Lee et al. | 327/105 |
| 5,629,651 | * 5/1997 | Mizuno | 327/158 |
| 5,642,082 | 6/1997 | Jefferson | 331/25 |
| 5,652,530 | 7/1997 | Ashuri | 326/93 |
| 5,655,113 | 8/1997 | Leung et al. | 395/552 |
| 5,663,665 | 9/1997 | Wang et al. | 327/3 |
| 5,673,005 | 9/1997 | Pricer | 331/1 R |
| 5,699,003 | 12/1997 | Saeki | 327/261 |
| 5,717,652 | 2/1998 | Ooishi | 365/233 |
| 5,745,011 | 4/1998 | Scott | 331/44 |
| 5,757,240 | 5/1998 | Boerstler et al. | 331/34 |
| 5,828,250 | 10/1998 | Konno | 327/116 |

(List continued on next page.)

FOREIGN PATENT DOCUMENTS

| | | | |
|---|---|---|---|
| 2 308 250 A | 6/1997 | (GB) | |
| 06-61849 | 3/1994 | (JP) | |
| 09-098072 | 4/1997 | (JP) | |

*Primary Examiner*—Dinh T. Le
(74) *Attorney, Agent, or Firm*—Myers Bigel Sibley & Sajovec

(57) ABSTRACT

Phase locked loop integrated circuits include a phase detection circuit, a variable delay device and a delay control circuit. The variable delay device and delay control circuit provide improved characteristics by increasing the signal frequency bandwidth of the delay locked loop integrated circuit in a preferred manner. The phase detection circuit is configured to perform the functions of comparing first and second periodic signals and generating a phase control signal (e.g., VCON) having a first property (e.g., magnitude) that is proportional to a difference in phase between the first and second periodic signals. The delay control circuit is responsive to the phase control signal VCON and generates a delay control signal that is provided to the variable delay device. The delay control circuit may comprise a counter, a first comparator, a second comparator and a shift register. The variable delay device includes a variable delay line and a compensation delay device. The variable delay line may contain a string of unit delay devices and a string of switches that each have an input electrically coupled to an output of a corresponding unit delay device. Each of the unit delay devices in the string may provide a fixed delay or a variable delay that is influenced (e.g., increased) by changes (e.g., increases) in the magnitude of the phase control signal VCON.

38 Claims, 4 Drawing Sheets

U.S. PATENT DOCUMENTS

| | | | |
|---|---|---|---|
| 5,847,617 | 12/1998 | Reddy et al. | 331/57 |
| 5,877,656 | 3/1999 | Mann et al. | 331/16 |
| 5,886,946 | 3/1999 | Ooishi | 365/233 |
| 5,907,253 | 5/1999 | Davis et al. | 327/156 |
| 5,930,182 | 7/1999 | Lee | 365/194 |
| 6,100,736 * | 8/2000 | Mizuno | 327/150 |

* cited by examiner

PHASE LOCKED LOOP INTEGRATED CIRCUITS HAVING DYNAMIC PHASE LOCKING CHARACTERISTICS AND METHODS OF OPERATING SAME

RELATED APPLICATION

This application is related to Korean Application No. 98-36094, filed Sep. 2, 1998, the disclosure of which is hereby incorporated herein by reference.

1. Field of the Invention

The present invention relates to integrated circuit devices, and more particularly to integrated circuit devices containing phase locked loops and methods of operating same.

2. Background of the Invention

Many integrated circuit devices (e.g., memory devices) operate in-sync with externally supplied clock signals by generating one or more internal clock signals that are preferably phase locked with the external clock signal and with each other. As will be understood by those skilled in the art, accurate phase locking of clock signals may be especially important for integrated circuit devices that operate a high frequencies.

FIG. 1 illustrates a conventional phase locked loop integrated circuit that includes a phase detector 110, a charge pump circuit 130, a voltage controlled delay line (VDL) 150, and a compensation delay device 170 that provides a fixed delay. The phase detector 110 compares the phase of an external clock signal CLK against an internal clock signal PCLK and generates a phase detected signal (PDS) at an output thereof. The phase detected signal PDS may have a pulse width proportional to the magnitude of the phase difference between the external clock CLK and internal clock PCLK. The charge pump circuit 130 may also perform the function of generating a phase control signal VCON in response to the phase detected signal PDS. In particular, the charge pump circuit 130 may perform the function of increasing the magnitude of the phase control signal VCON in response to an increase in the pulse width of the phase detected signal PDS and vice versa.

As illustrated, the voltage controlled delay line (VDL) 150 comprises a plurality of unit delay devices 151–154 and generates a delayed version of the external clock signal CLK as signal DCLK. In particular, signal DCLK is out-of-phase relative to the external clock signal by a delay equal to the sum of the delays provided by the unit delay devices 151–154. The delay provided by each of these unit delay devices 151–154 may vary depending on the magnitude of the phase control signal VCON. For example, the individual delays provided by the unit delay devices 151–154 may decrease with increases in the magnitude of the phase control signal VCON. The delay provided by the voltage controlled delay line 150 may therefore automatically decrease as the phase difference ($\phi$) between the internal clock signal PCLK and the external clock signal CLK increases in response to an increase in the frequency of the external clock signal CLK. Alternatively, the delay provided by the voltage controlled delay line 150 may automatically increase as the phase difference ($\phi$) between the internal clock signal PCLK and the external clock signal CLK decreases (e.g., becomes more negative) in response to a decrease in the frequency of the external clock signal CLK.

Unfortunately, because the delay-voltage characteristics of the unit delay devices 151–154 may be non-linear (and may also saturate at high and low VCON), the overall delay provided by the voltage controlled delay line 150 may not have symmetric low frequency and high frequency characteristics (i.e., the change in delay/change in voltage at large VCON may not be the same as the change in delay/change in voltage at small VCON). Moreover, once the number of unit delay devices in the voltage controlled delay line 150 is fixed at a predetermined number, the operating frequency range of the integrated circuit become similarly fixed.

Thus, notwithstanding the above-described phase locked loop integrated circuit, there continues to be a need for improved phase locked loop integrated circuits having greater signal frequency bandwidth and other improved characteristics.

SUMMARY OF THE INVENTION

It is therefore an object of the present invention to provide improved phase locked loop integrated circuits and methods of operating same.

It is another object of the present invention to provide phase locked loop integrated circuits having wide signal frequency bandwidth and methods of operating same.

It is still another object of the present invention to provide phase locked loop integrated circuits that can adjust dynamically to input signals having varying frequencies and methods of operating same.

It is yet another object of the present invention to provide phase locked loop integrated circuits that have reduced susceptibility to signal jitter and methods of operating same.

These and other objects, advantages and features of the present invention are provided by delay locked loop integrated circuits that preferably include a phase detection circuit, a variable delay device and a delay control circuit. The variable delay device and delay control circuit provide improved characteristics by increasing the signal frequency bandwidth of the delay locked loop integrated circuit in a preferred manner. The phase detection circuit is configured to perform the functions of comparing first and second periodic signals and generating a phase control signal (e.g., VCON) having a first property (e.g., magnitude) that is proportional to a difference in phase between the first and second periodic signals. These first and second periodic signals may be an external clock signal CLK and an internal clock signal PCLK, respectively. The magnitude of the phase control signal VCON may be controlled to increase as the phase difference between the external clock signal CLK and internal clock signal PCLK increases and decrease as the phase difference decreases.

The phase detection circuit may comprise a phase detector that receives the external clock signal CLK and the internal clock signal PCLK and generates a phase detected signal (PDS). The phase detected signal PDS may have a pulse width proportional (e.g., directly proportional) to the difference in phase between the external clock signal CLK and the internal clock signal PCLK. The phase detection circuit may also comprise a charge pump circuit that generates the phase control signal VCON in response to the phase detected signal PDS. The charge pump circuit may perform the function of increasing the magnitude of the phase control signal VCON in response to an increase in the pulse width of the phase detected signal PDS.

The delay control circuit is responsive to the phase control signal VCON and generates a delay control signal that is provided to the variable delay device. The delay control circuit may comprise a counter that generates a control clock signal in response to the internal clock signal PCLK. The delay control circuit also preferably comprises a first comparator, a second comparator and a shift register. The first comparator compares the phase control signal VCON against a "high" first property (e.g., magnitude) threshold (VREFH) and the second comparator compares the phase control signal VCON against a "low" first property (e.g., magnitude) threshold (VREFL). The output of the first comparator is electrically connected to a DOWN signal line and the output of the second comparator is electrically connected to an UP signal line. Based on a voltage comparison, the DOWN signal line is driven to a logic 1 level whenever the magnitude of the phase control signal VCON is greater than VREFH and is held at a logic 0 level whenever the magnitude of the phase control signal VCON is less than VREFH. Alternatively, the UP signal line is driven to a logic 1 level whenever the magnitude of the phase control signal VCON is less than VREFL and is held at a logic 0 level whenever the magnitude of the phase control signal VCON is greater than VREFL. Based on this configuration of the first and second comparators, the UP and DOWN signal lines are both held at logic 0 levels whenever the magnitude of the phase control signal VCON is within a predetermined range (i.e., VREFL≦VCON≦VREFH). The "width" of this range is preferably designed to establish a desired degree of "locking" between the phases of the external clock signal CLK and the internal clock signal PCLK during normal operation.

The shift register within the delay control circuit is responsive to signals on the UP, DOWN and control clock signal lines. The shift register also preferably comprises a string of multiplexers ($M_0$–$M_{N+L}$) and a string of latches ($D_0$–$D_{N+L}$) which each have a data input (D) electrically coupled to an output (O) of a corresponding multiplexer in the string. Each multiplexer and corresponding latch comprise a register cell within the plurality of register cells. The clock inputs to the latches receive the control clock signal. The outputs of the latches $D_0$–$D_{N+L-1}$ are electrically connected to second inputs 12 of multiplexers $M_1$–$M_{N+L}$, so that an "up-count" function can be performed dynamically by the shift register when a logic 1 signal is generated at the output of the second comparator. The outputs of latches $D_1$–$D_{N+L}$ are also electrically connected to the first inputs I1 of multiplexers $M_0$–$M_{N+L-1}$ and the output of the latch Do is electrically connected to the first input I1 of the last multiplexer $M_{N+L}$, so that a "down-count" function can be performed dynamically by the shift register when a logic 1 signal is generated at the output of the first comparator. A plurality of NMOS pull-down transistors $P_0$–$P_{N-1}$ and $P_{N+1}$–$P_{N+L}$ and an NMOS pull-up transistor $P_N$ are also provided so that the delay control signal $S_0$–$S_{N+L}$ can be initialized to an intermediate binary value (e.g., {000 . . . 010 . . . 000}) whenever a logic 1 pulse generated on an inverted power-up signal line VCCHB. The placement of the logic 1 value within the binary delay control signal $S_0$–$S_{N+L}$ establishes the amount of delay that will be initially provided by the variable delay device upon start up.

The variable delay device preferably includes a variable delay line and a compensation delay device. The compensation delay device generates an internal clock signal PCLK by adding a fixed delay to the signal generated on the delayed clock signal line DCLK by the variable delay line. The variable delay line may contain a string of unit delay devices and a string of switches that each have an input electrically coupled to an output of a corresponding unit delay device. Each of the unit delay devices in the string may provide a fixed delay or a variable delay that is influenced (e.g., increased) by changes (e.g., increases) in the magnitude of the phase control signal VCON. With the exception of the last switch in the string, each of the other switches has a first output electrically coupled to an input of a next higher unit delay device in the string thereof, and a second output electrically connected to the output of the last switch in the string and the output of the variable delay line. The switches in the string also have control inputs that receive respective bits within the binary delay control signal $S_0$–$S_{N+L}$. In particular, when the control input of a respective switch receives a logic 1 signal, the signal at the input of the switch is routed to its second output and also directly to the end of the variable delay line. Thus, once any switch in the string receives a logic 1 signal, all higher unit delay devices are bypassed.

The delay between a leading edge of the external clock signal CLK and a corresponding leading edge of the internal clock signal PCLK will equal the sum of the delay associated with the compensation delay device and the sum of the delays associated with the individual unit delay devices the external clock signal must pass through before being routed directly to the output of the variable delay line. Thus, the binary value of the delay control signal controls the degree to which the external clock signal CLK and the internal clock signal PCLK will be locked in-phase.

Preferred methods of operating phase locked loop integrated circuits also include the steps of generating a phase control signal (e.g., VCON) having a first property (e.g., magnitude) that is proportional to a difference in phase between first and second periodic signals, and generating a delay control signal (e.g., $S_0$–$S_{N+L}$) by comparing the phase control signal against at least one first property threshold. The delay associated with a delay device is then adjusted, based on a value of the delay control signal. As described above, the delay device generates the second periodic signal (e.g., PCLK) as a delayed version of the first periodic signal (CLK). In particular, the step of generating the delay control signal preferably comprises generating the delay control signal by comparing a magnitude of the phase control signal against first and second different reference voltages (e.g., VREFH and VREFL). In addition, if the delay control signal is a multi-bit binary signal, then the step of generating a delay control signal is preferably preceded by the step of initializing the delay control signal to a first binary value (e.g., {00 . . . 010 . . 000}. The step of generating the delay control signal may also comprise the step of generating the delay control signal to have a second binary value greater than the first binary value if the magnitude of the phase control signal is less than the second reference voltage or have a third binary value less than the first binary value if the magnitude of the phase control signal is greater than the first reference voltage.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
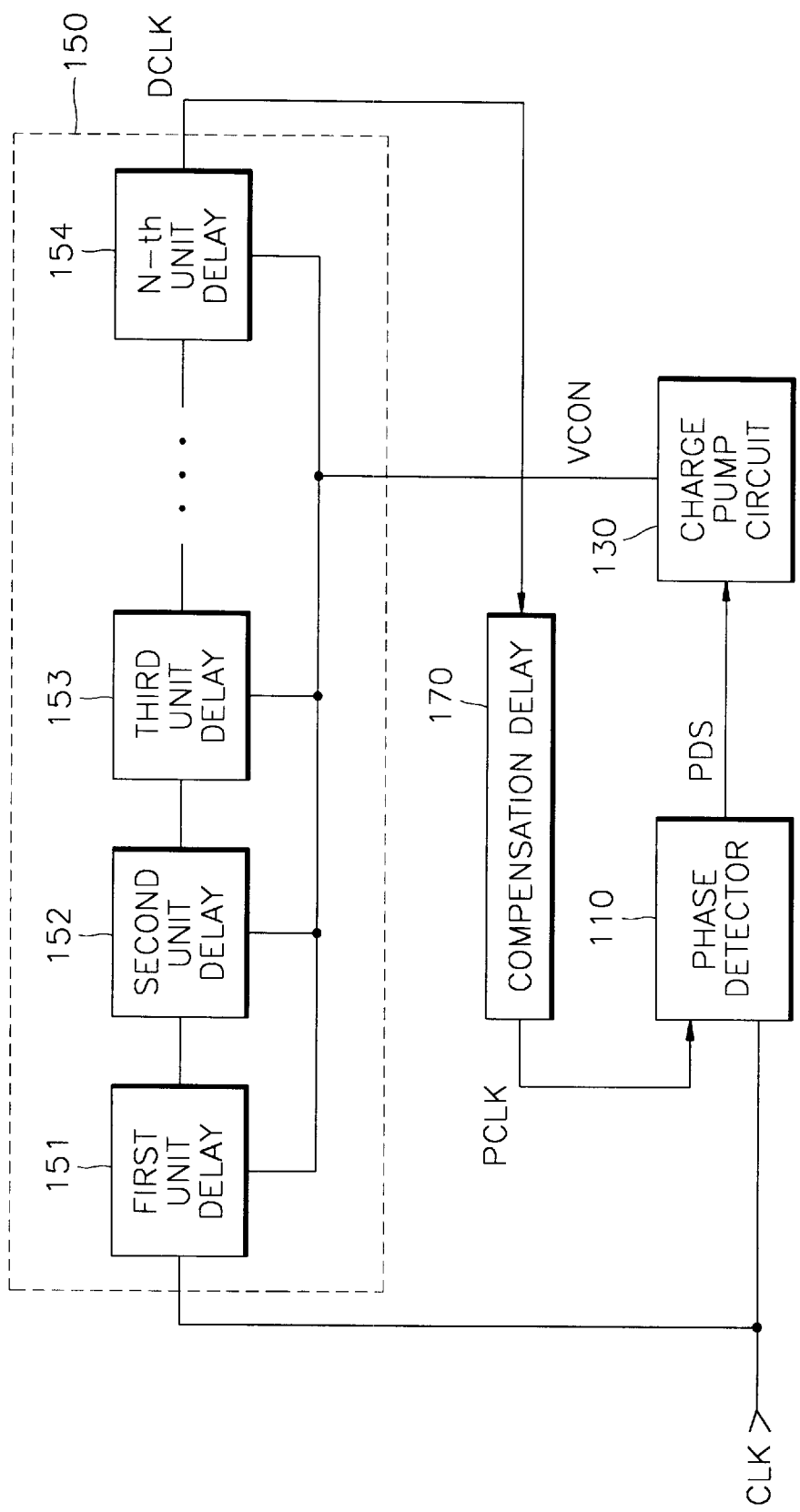
FIG. 1 is a block diagram of a conventional delay locked loop integrated circuit.
Figure 2:
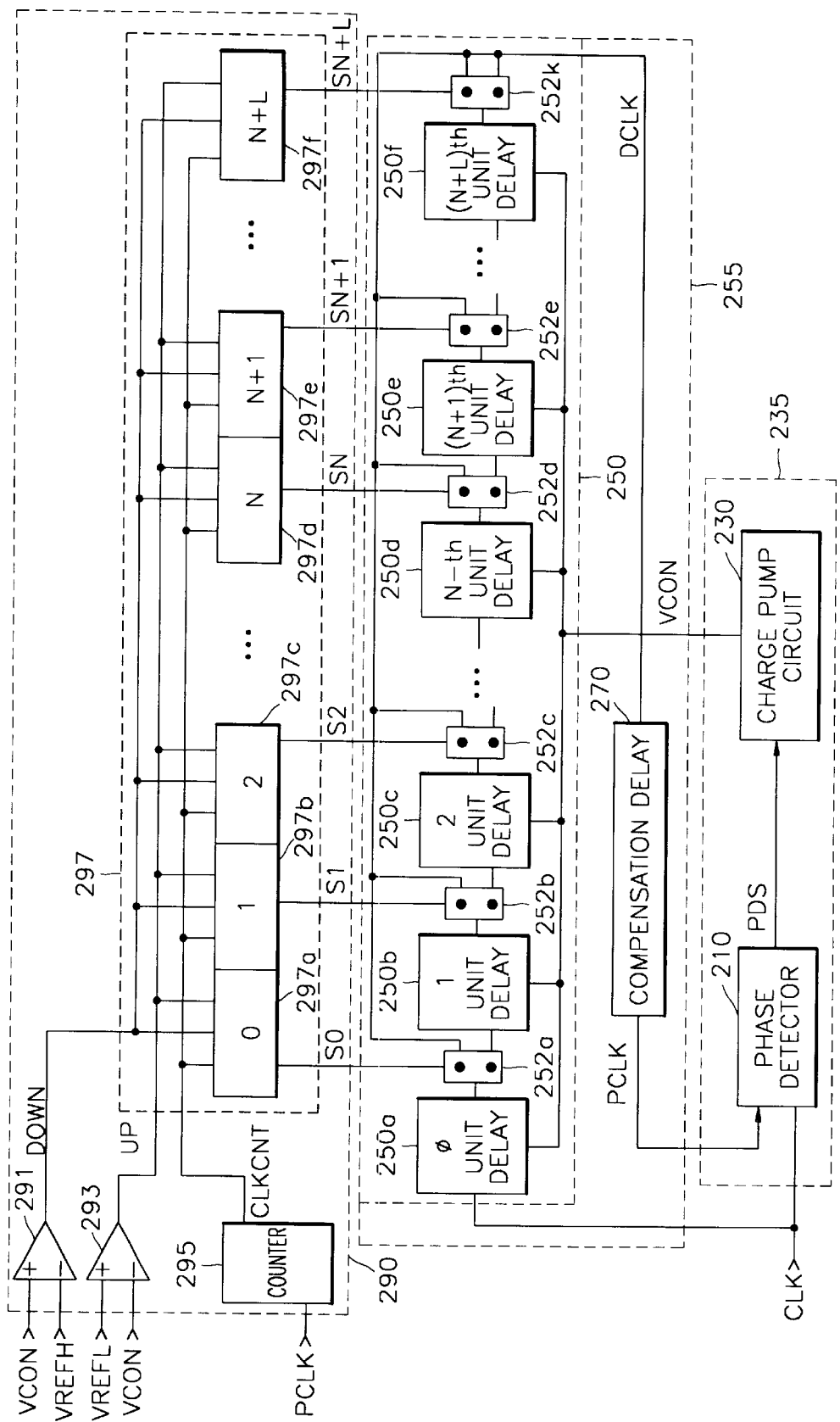
FIG. 2 is an electrical schematic of a delay locked loop integrated circuit according to an embodiment of the present invention.
Figure 3:
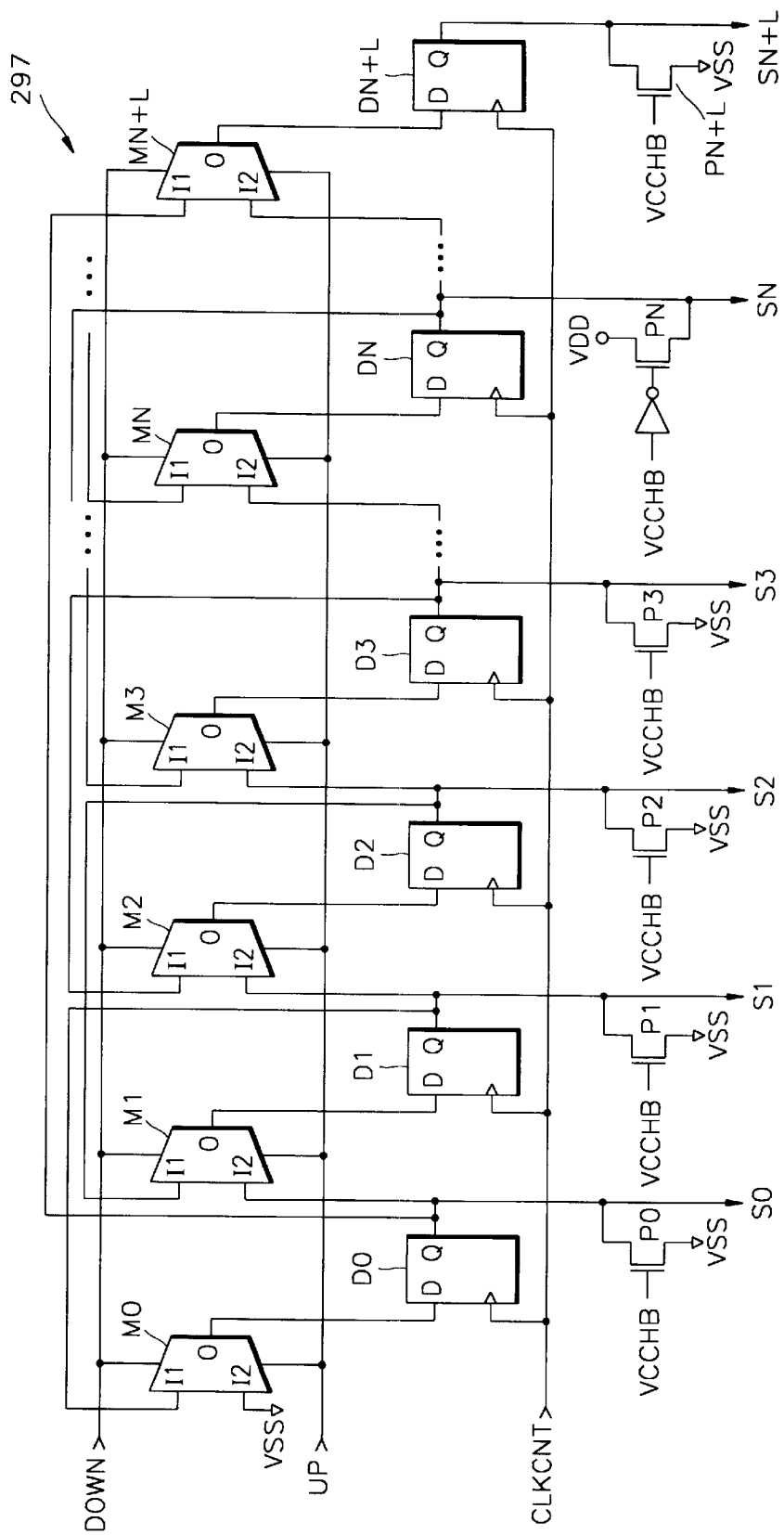
FIG. 3 is an electrical schematic of a preferred shift register which is part of a control circuit illustrated in FIG. 2.
Figure 4:
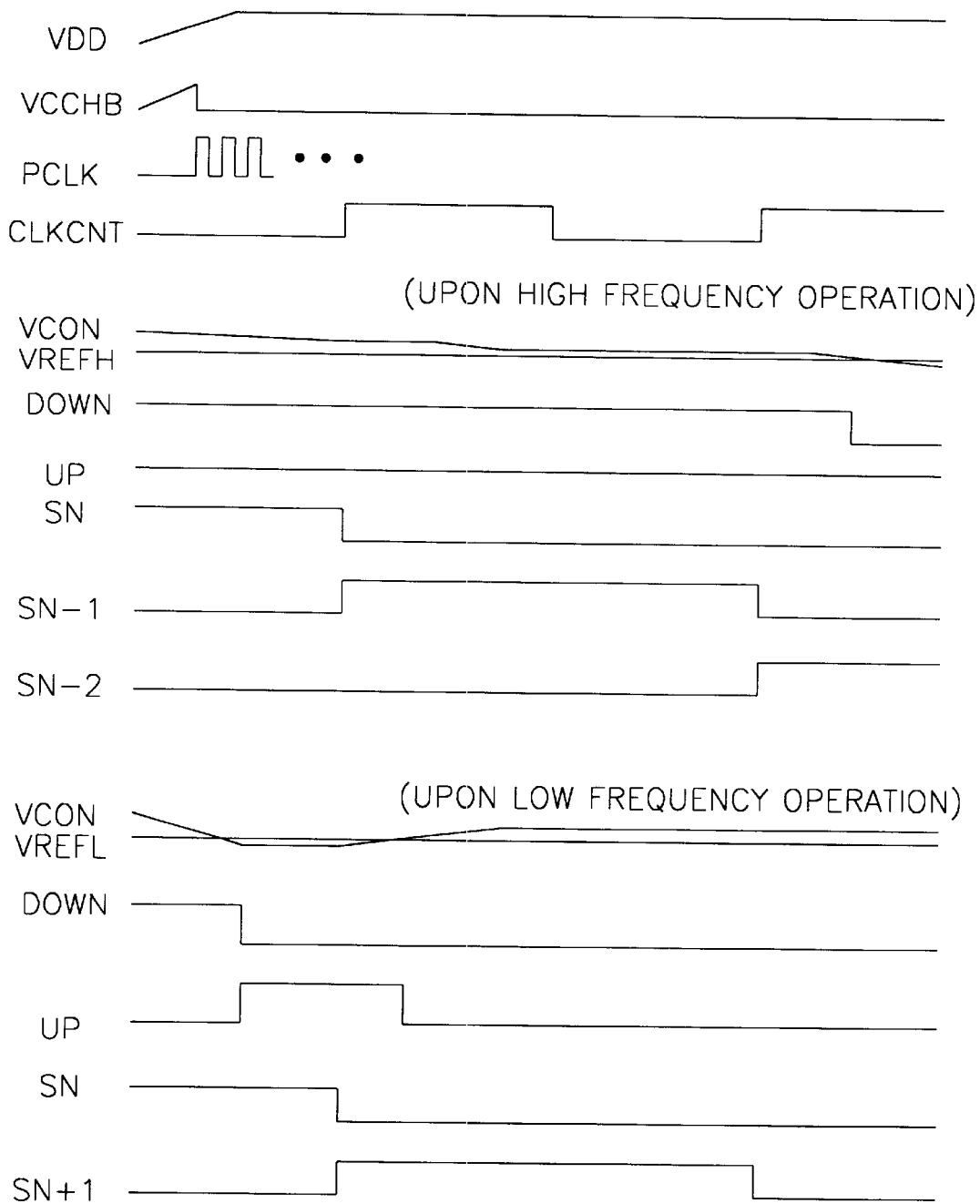
FIG. 4 is a timing diagram that illustrates operation of the delay locked loop integrated circuit of FIG. 2.

Referring now to FIGS. 2–4, preferred delay locked loop integrated circuits according to the present invention will be described. In particular, FIG. 2 illustrates a preferred delay locked loop integrated circuit that includes a phase detection circuit 235, a variable delay device 255 and a delay control circuit 290. The variable delay device 255 and delay control circuit 290 provide improved characteristics by increasing the signal frequency bandwidth of the delay locked loop integrated circuit in a preferred manner.

The phase detection circuit 235 is configured to perform the functions of comparing first and second periodic signals and generating a phase control signal (e.g., VCON) having a first property that is proportional to a difference in phase between the first and second periodic signals. As illustrated, these first and second periodic signals may be an external clock signal CLK and an internal clock signal PCLK, respectively. The first property of the phase control signal may be its magnitude, however, other properties (e.g., pulse width, frequency, etc.) may also be utilized. In particular, the magnitude of the phase control signal VCON may be controlled to increase as the phase difference between the external clock signal CLK and internal clock signal PCLK increases and decrease as the phase difference decreases. As illustrated, the phase detection circuit 235 preferably comprises a phase detector 210 that receives the external clock signal CLK and the internal clock signal PCLK and generates a phase detected signal (PDS). The phase detected signal PDS may have a pulse width proportional (e.g., directly proportional) to the difference in phase between the external clock signal CLK and the internal clock signal PCLK. The phase detection circuit 235 may also comprise a charge pump circuit 230 that generates the phase control signal VCON in response to the phase detected signal PDS. The charge pump circuit 230 may increase the magnitude of the phase control signal VCON in response to an increase in the pulse width of the phase detected signal PDS.

The delay control circuit 290 is responsive to the phase control signal VCON and generates a delay control signal $S_0$–$S_{N+L}$ that is provided to the variable delay device 255. As illustrated, the delay control circuit 290 preferably comprises a counter 295 of conventional design that generates a control clock signal CLKCNT in response to the internal clock signal PCLK. As illustrated by the timing diagram of FIG. 4, the control clock signal CLKCNT may have a period that is greater than a period of the internal clock signal PCLK by an integer factor greater than one, for example. The delay control circuit 290 also comprises a first comparator 291, a second comparator 293 and a shift register 297. The first comparator 291 compares the phase control signal VCON against a "high" first property (e.g., magnitude) threshold (VREFH) and the second comparator 293 compares the phase control signal VCON against a "low" first property (e.g., magnitude) threshold (VREFL). The output of the first comparator 291 is electrically connected to a DOWN signal line and the output of the second comparator 293 is electrically connected to an UP signal line. Based on a voltage comparison, the DOWN signal line is driven to a logic 1 level whenever the magnitude of the phase control signal VCON is greater than VREFH and is held at a logic 0 level whenever the magnitude of the phase control signal VCON is less than VREFH. Alternatively, the UP signal line is driven to a logic 1 level whenever the magnitude of the phase control signal VCON is less than VREFL and is held at a logic 0 level whenever the magnitude of the phase control signal VCON is greater than VREFL. Based on this configuration of the first and second comparators 291 and 293, the UP and DOWN signal lines are both held at logic 0 levels whenever the magnitude of the phase control signal VCON is within a predetermined range (i.e., VREFL≦VCON≦VREFH). The "width" of this range is preferably designed to establish a desired degree of "locking" between the phases of the external clock signal CLK and the internal clock signal PCLK during normal operation. If the width of this range is too small, jitter between the external clock signal CLK and internal clock signal PCLK may occur.

Referring now to FIG. 3, the shift register 297 within the delay control circuit 297 is responsive to signals on the UP, DOWN and control clock CLKCNT signal lines. The shift register 297 also preferably comprises a string of N+L+1 multiplexers ($M_0$–$M_{N+L}$) and a string of N+L+1 latches ($D_0$–$D_{N+L}$) which each have a data input (D) electrically coupled to an output (O) of a corresponding multiplexer in the string, as illustrated. As used herein, reference characters N and L represent integers greater than or equal to one and reference character X equals N+L+1. Each multiplexer and corresponding latch comprise a register cell within the plurality of register cells 297a–297f. The clock inputs to the latches receive the control clock signal CLKCNT. The outputs of the latches $D_0$–$D_{N+L-1}$ are electrically connected to second inputs I2 of multiplexers $M_1$–$M_{N+L}$, as illustrated, so that an "up-count" function can be performed by the shift register 297 when a logic 1 signal is generated at the output of the second comparator 293. The outputs of latches $D_1$–$D_{N+L}$ are also electrically connected to the first inputs I1 of multiplexers $M_0$–$M_{N+L-1}$ and the output of the latch $D_0$ is electrically connected to the first input I1 of the last multiplexer $M_{N+L}$, SO that a "down-count" function can be performed by the shift register 297 when a logic 1 signal is generated at the output of the first comparator 291. A plurality of NMOS pull-down transistors $P_0$–$P_{N-1}$ and $P_{N+1}$–$P_{N+L}$ and a PMOS pull-up transistor $P_N$ (and inverter) are also provided so that the delay control signal $S_0$–$S_{N+L}$ can be initialized to an intermediate binary value (e.g., {000 . . . 010 . . . 000}) whenever a logic 1 pulse generated on an inverted power-up signal line VCCHB. The placement of the logic 1 value within the binary delay control signal $S_0$–$S_{N+L}$ establishes the amount of delay that will be initially provided by the variable delay device 255 upon start up.

Referring again to FIG. 2, the variable delay device 255 includes a variable delay line 250 and a compensation delay device 270. The compensation delay device 270 generates an internal clock signal PCLK by adding a fixed delay to the signal generated on the delayed clock signal line DCLK by the variable delay line 250. As illustrated, the variable delay line 250 contains a string of 1+N+L unit delay devices 250a–250f and a string of 1+N+L switches 252a–252f that each have an input electrically coupled to an output of a corresponding unit delay device. Each of the unit delay devices in the string may provide a fixed delay or a variable delay that is influenced (e.g., increased) by changes (e.g., increases) in the magnitude of the phase control signal VCON. The delay attributable to each unit delay device in the string may be expressed as "$T_{udd}$". With the exception of the last switch 252f in the string, each of the other switches has a first output electrically coupled to an input of a next higher unit delay device in the string thereof, and a second output electrically connected to the output of the last switch 252f in the string and the output of the variable delay line 250. The switches in the string also have control inputs that receive respective bits within the binary delay control signal $S_0$-$S_{N+L}$. In particular, when the control input of a respective switch receives a logic 1 signal, the signal at the input of the switch is routed to its second output and also directly to the end of the variable delay line 250. Thus, once any switch in the string receives a logic 1 signal, all higher unit delay devices are bypassed.

Accordingly, the delay between a leading edge of the external clock signal CLK and a corresponding leading edge of the internal clock signal PCLK will equal the sum of the delay associated with the compensation delay device 270 (i.e., $T_{cdd}$) and the sum of the delays associated with the individual unit delay devices the external clock signal must pass through before being routed directly to the output of the variable delay line 250. For example, if the value of the binary delay control signal $S_0$-$S_{N+L}$ is set to {00001000 . . . 000}, the total delay ($T_t$) between a leading edge of the external clock signal CLK and a corresponding leading edge of the internal clock signal PCLK will be defined by the following expression:

$$T_t = T_{cdd} + nT_{udd} \qquad (1)$$

where n equals 5. As will be understood by those skilled in the art, this total delay $T_t$ between corresponding leading edges of the external clock signal CLK and the internal clock signal PCLK can also be translated into a phase difference φ between these signals. Likewise, if the value of the binary delay control signal $S_0$-$S_{N+L}$ is set to {00100000 . . . 000}, the total phase delay ($T_t$) between a leading edge of the external clock signal CLK and a corresponding leading edge of the internal clock signal PCLK will be equal to: $T_{cdd}$+ $3T_{udd}$. Thus, the binary value of the delay control signal controls the degree to which the external clock signal CLK and the internal clock signal PCLK will be out-of-phase relative to each other. As will be understood by those skilled in the art, if the total delay $T_t$ is adjusted to be equal to an integer multiple of the period of the external clock signal CLK, then the external clock signal CLK and internal clock signal PCLK will be "locked" in phase.

Operation of the phase locked loop integrated circuit of FIG. 2 is also illustrated by FIG. 4. In particular, FIG. 4 illustrates how the phase "locking" between the external clock signal CLK and internal clock signal PCLK can be achieved dynamically by the phase detection circuit 235, the variable delay device 255 and the delay control circuit 290. As illustrated, upon power-up, the state of the shift register 297 is initialized in response to a logic 1 pulse being generated on signal line VCCHB. If, upon start-up during high frequency operation, the magnitude of the phase control signal VCON is greater than VREFH, a logic 1 down signal DOWN will be generated continuously until the magnitude of the phase control signal VCON drops below the level VREFH. While the down signal DOWN is being generated at a logic 1 level, each leading edge of the control clock signal CLKCNT will cause the shift register 290 to "down-shift" the placement of the logic 1 bit within the delay control signal $S_0$-$S_{N+L}$ through the sequence $S_N \rightarrow S_{N-1} \rightarrow S_{N-2}$ . . . Accordingly, if the magnitude of the phase control signal VCON is greater than VREFH, the delay provided by the variable delay line 250 will be reduced in stages until the magnitude of the phase control signal VCON indicates a desired degree of phase "locking" between the external clock signal CLK and internal clock signal PCLK.

Alternatively, if, during low frequency operation, the magnitude of the phase control signal VCON becomes less than VREFL, a logic 1 up signal UP will be generated until the magnitude of the phase control signal VCON rises above the level VREFL. While the up signal UP is being generated at a logic 1 level, each leading edge of the control clock signal CLKCNT will cause the shift register 290 to "up-shift" the placement of the logic 1 bit within the delay control signal $S_0$-$S_{N+L}$ through the sequence $S_N \rightarrow S_{N+1}$ . . . Accordingly, if the magnitude of the phase control signal VCON is less than VREFL, the delay provided by the variable delay line 250 will be increased in stages until the magnitude of the phase control signal VCON indicates a desired degree of phase "locking" between the external clock signal CLK and internal clock signal PCLK.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase locked loop integrated circuit, comprising:
 a phase detection circuit that compares first and second periodic signals and generates a phase control signal having a magnitude that is proportional to a difference in phase between the first and second periodic signals;
 a delay control circuit that compares the phase control signal against a first property threshold and generates a delay control signal in response to the comparison; and
 a variable delay device that receives the first periodic signal and the delay control signal and generates the second periodic signal which is locked in phase to the first periodic signal to a degree established by a binary value of the delay control signal.

2. The circuit of claim 1, wherein said variable delay device receives the phase control signal and comprises a plurality of unit delay devices; and wherein a delay associated with at least one of the plurality of unit delay devices is proportional to the magnitude of the phase control signal.

3. The circuit of claim 1, wherein said variable delay device comprises:
 a string of X unit delay devices; and
 a string of X switches that each have an input electrically coupled to an output of a corresponding unit delay device.

4. The circuit of claim 3, wherein each of the first through X-1 switches has a first output electrically coupled to an input of a next higher unit delay device in the string thereof.

5. The circuit of claim 4, wherein the first through X-1 switches have second outputs that are electrically connected together and to an output of the Xth switch.

6. The circuit of claim 5, wherein said variable delay device also comprises a compensation delay device having an input electrically connected to an output of the Xth switch and an output that generates the second periodic signal.

7. The circuit of claim 6, wherein said phase detection circuit comprises:
 a phase detector that receives the first and second periodic signals and generates a phase detected signal having a pulse width proportional to the difference in phase between the first and second periodic signals; and
 a charge pump that converts the phase detected signal into the phase control signal.

8. The circuit of claim 7, wherein said delay control circuit comprises:

first and second comparators; and a shift register having down and up control inputs that are electrically coupled to an output of the first comparator and an output of the second comparator, respectively.

9. The circuit of claim 8, wherein said variable delay device receives the phase control signal; and wherein a delay associated with each of the unit delay devices in the string thereof is proportional to the magnitude of the phase control signal.

10. A phase locked loop integrated circuit, comprising:

a phase detection circuit that compares first and second periodic signals and generates a phase control signal having a first property that is proportional to a difference in phase between the first and second periodic signals;

a delay control circuit that compares the phase control signal against a first property threshold and generates a delay control signal in response to the comparison, said delay control circuit comprising first and second comparators and a shift register having down and up control inputs that are electrically coupled to an output of the first comparator and an output of the second comparator, respectively; and a variable delay device that receives the first periodic signal and the delay control signal and generates the second periodic signal which is out-of-phase relative to the first periodic signal by a phase difference $\phi$ that is based on a second property of the delay control signal.

11. The circuit of claim 10, wherein positive and negative terminals of the first and second comparators, respectively, receive the phase control signal.

12. The circuit of claim 10, wherein said shift register comprises:

a string of X multiplexers; and a string of X latches that each have a data input electrically coupled to an output of a corresponding multiplexer.

13. The circuit of claim 12, wherein the Xth multiplexer has a first input electrically connected to an output of the first latch and a second input electrically connected to an output of the X-1 latch.

14. The circuit of claim 13, wherein the X-1 multiplexer has a first input electrically connected to an output of the Xth latch and a second input electrically connected to an output of the X-2 latch.

15. The circuit of claim 14, wherein each of the X multiplexers has first and second selection inputs that are electrically connected to the outputs of the first and second comparators, respectively.

16. A phase locked loop integrated circuit, comprising:

a phase detection circuit that generates a phase control signal;

a delay control circuit that compares a magnitude of the phase control signal against first and second unequal reference voltages and generates a multi-bit binary delay control signal in response to the comparison; and a variable delay device that receives a first clock signal and the delay control signal and generates a second clock signal that is phase-locked with the first clock signal to a degree established by a value of the delay control signal.

17. The circuit of claim 16, wherein said variable delay device comprises:

a string of X unit delay devices; and a string of X switches that each have an input electrically coupled to an output of a corresponding unit delay device.

18. The circuit of claim 17, wherein each of the first through X-1 switches has a first output electrically coupled to an input of a next higher unit delay device in the string thereof.

19. The circuit of claim 18, wherein the first through X-1 switches have second outputs that are electrically connected together and to an output of the Xth switch.

20. The circuit of claim 19, wherein said variable delay device also comprises a compensation delay device having an input electrically connected to an output of the Xth switch and an output that generates the second clock signal.

21. A phase locked loop integrated circuit, comprising:

a phase detection circuit that generates a phase control signal;

a delay control circuit that compares a magnitude of the phase control signal against first and second unequal reference voltages and generates a multi-bit binary delay control signal in response to the comparison, said delay control circuit comprising first and second comparators and a shift register having down and up control inputs that are electrically coupled to an output of the first comparator and an output of the second comparator, respectively; and a variable delay device that receives a first clock signal and the delay control signal and generates a second clock signal that is in-phase with the first clock signal to a degree established by a value of the delay control signal.

22. The circuit of claim 21, wherein positive and negative terminals of the first and second comparators, respectively, receive the phase control signal.

23. The circuit of claim 21, wherein said shift register comprises:

a string of X multiplexers; and a string of X latches that each have a data input electrically coupled to an output of a corresponding multiplexer.

24. The circuit of claim 23, wherein the Xth multiplexer has a first input electrically connected to an output of the first latch and a second input electrically connected to an output of the X-1 latch.

25. The circuit of claim 24, wherein the X-1 multiplexer has a first input electrically connected to an output of the Xth latch and a second input electrically connected to an output of the X-2 latch.

26. The circuit of claim 25, wherein each of the X multiplexers has first and second selection inputs that are electrically connected to the outputs of the first and second comparators, respectively.

27. A method of operating a phase locked loop, comprising the steps of:

generating a phase control signal having a first property that is proportional to a difference in phase between first and second periodic signals;

generating a delay control signal by comparing a magnitude of the phase control signal against first and second different reference voltages; and adjusting, based on a value of the delay control signal, the delay associated with a delay device that generates the second periodic signal as a delayed version of the first periodic signal;

wherein the delay control signal is a multi-bit binary signal;

wherein said step of generating a delay control signal is preceded by the step of initializing the delay control signal to a first binary value; and wherein said step of generating a delay control signal comprises generating a delay control signal having a second binary value greater than the first binary value if the magnitude of the phase control signal is less than the second reference voltage.

28. The method of claim 27, wherein said step of generating a delay control signal comprises generating a delay control signal having a third binary value less than the first binary value if the magnitude of the phase control signal is greater than the first reference voltage.

29. A phase locked loop circuit for a semiconductor memory device, comprising:
   a phase detector for comparing a phase of an external clock with a phase of an internal clock and detecting a phase difference therebetween;
   a charge pump circuit for converting the phase difference into a control voltage;
   a voltage controlled delay line including a plurality of unit delays, for delaying the external clock via unit delays connected to each other in series among the plurality of unit delays and generating the internal clock; and
   a control unit for varying a delay time of said voltage controlled delay line by varying a number of unit delays in the plurality of unit delays that are connected to each other in series, in response to the control voltage;
   wherein the control unit comprises a unit for reducing the number of unit delays connected to each other in series to shorten the delay time of said voltage controlled delay line when the control voltage is higher than a first reference voltage, and for increasing the number of unit delays connected to each other in series to lengthen the delay time of said voltage control delay line when the control voltage is lower than a second reference voltage; and wherein the unit comprises:
      a first comparator for comparing the control voltage with the first reference voltage and generating a first compare signal;
      a second comparator for comparing the control voltage with the second reference voltage and generating a second compare signal;
      a counter for dividing the internal clock; and
      a shift register for decreasing the number of unit delays connected to each other in series by down-shifting a plurality of control signals for controlling the voltage controlled delay line in response to the divided internal clock while the first compare signal is activated, and increasing the number of unit delays connected to each other in series by up-shifting a plurality of control signals for controlling the voltage controlled delay line in response to the divided internal clock while the second compare signal is activated.

30. The phase locked loop circuit for a semiconductor memory device as claimed in claim 29, wherein the voltage control delay line further comprises:
   a plurality of switches respectively interposed between the adjacent unit delays, for connecting two adjacent unit delays among the unit delays in response to a corresponding control signal among the plurality of control signals.

31. The phase locked loop circuit for a semiconductor memory device as claimed in claim 29, wherein the first compare signal is activated when the control voltage is higher than the first reference voltage.

32. The phase locked loop circuit for a semiconductor memory device as claimed in claim 29, wherein the second compare signal is activated when the control voltage is lower than the second reference voltage.

33. The phase locked loop circuit for a semiconductor memory device as claimed in claim 29, wherein the first reference voltage is higher than the second reference voltage.

34. The phase locked loop circuit for a semiconductor memory device as claimed in claim 29, wherein the shift register is initialized so that only one control signal among the plurality of control signals can be activated.

35. A phase locked loop circuit for a semiconductor memory device, comprising:
   a phase detector for comparing a phase of an external clock with a phase of an internal clock and detecting a phase difference therebetween;
   a charge pump circuit for converting the phase difference into a control voltage;
   a voltage controlled delay line including a plurality of unit delays, for delaying the external clock via unit delays connected to each other in series among the plurality of unit delays and generating the internal clock; and
   a control unit for varying a delay time of said voltage controlled delay line by varying a number of unit delays in the plurality of unit delays that are connected to each other in series in response to the control voltage;
   wherein the control unit comprises a unit for reducing the number of unit delays connected to each other in series to shorten the delay time of said voltage controlled delay line when the control voltage is higher than a reference voltage and a unit for increasing the number of unit delays connected to each other in series to lengthen the delay time of said voltage controlled delay line when the control voltage is lower than a reference voltage;
   wherein the unit comprises:
      a comparator for comparing the control voltage with the reference voltage and generating a compare signal;
      a counter for dividing the internal clock; and
      a shift register for decreasing the number of unit delays connected to each other in series by down-shifting a plurality of control signals for controlling the voltage controlled delay line, in response to the divided internal clock, while the compare signal is activated.

36. The phase locked loop circuit for a semiconductor memory device as claimed in claim 35, wherein the voltage controlled delay line further comprises:
   a plurality of switches respectively interposed between the adjacent unit delays, for connecting two adjacent unit delays among the unit delays in response to a corresponding control signal among the plurality of control signals.

37. The phase locked loop circuit for a semiconductor memory device as claimed in claim 35, wherein the compare signal is activated when the control voltage is higher than the reference voltage.

38. The phase locked loop circuit for a semiconductor memory device as claimed in claim 35, wherein the shift register is initialized so that only one control signal among the plurality of control signals can be activated.

* * * * *